United States Patent [19]
Callahan, Jr.

[11] Patent Number: 5,917,313
[45] Date of Patent: Jun. 29, 1999

[54] DC-TO-DC CONVERTER WITH SOFT-START ERROR AMPLIFIER AND ASSOCIATED METHOD

[75] Inventor: Michael J. Callahan, Jr., Austin, Tex.

[73] Assignee: STMicroelectronics, Inc., Carrollton, Tex.

[21] Appl. No.: 08/994,923

[22] Filed: Dec. 19, 1997

[51] Int. Cl.⁶ ..................................................... G05F 1/40
[52] U.S. Cl. .......................................... 323/288; 323/901
[58] Field of Search .................................... 323/288, 284, 323/901

[56] References Cited

U.S. PATENT DOCUMENTS

| | | |
|---|---|---|
| 3,766,410 | 10/1973 | Elsaesser . |
| 3,995,228 | 11/1976 | Pass . |
| 4,453,193 | 6/1984 | Huang et al. . |
| 4,634,956 | 1/1987 | Davis et al. ............................. 323/288 |
| 5,084,811 | 1/1992 | Maige et al. . |
| 5,142,217 | 8/1992 | Gontowski, Jr. . |
| 5,148,115 | 9/1992 | Koakutsu et al. . |
| 5,264,782 | 11/1993 | Newton .................................. 323/288 |
| 5,532,645 | 7/1996 | Fagnani et al. . |

FOREIGN PATENT DOCUMENTS

| | | | |
|---|---|---|---|
| 0 281 117 A2 | 3/1988 | European Pat. Off. ......... | H03G 3/34 |
| WO 94/01928 | 1/1994 | WIPO .............................. | H03F 1/26 |

*Primary Examiner*—Shawn Riley
*Attorney, Agent, or Firm*—Theodore E. Galanthay; Lisa K. Jorgenson; Christopher F. Regan

[57] ABSTRACT

A DC-to-DC converter includes an error amplifier; a ramp generator for generating a ramp signal at the first input of the error amplifier independent of the output of the error amplifier and so that the output of the error amplifier ramps up at a relatively slow rate to avoid overshoot of the desired output voltage of the converter during the start-up phase of the converter; and a ramp disable circuit for disabling the ramp signal upon reaching a value corresponding to the normal operating phase of the converter. The DC-to-DC converter preferably includes at least one power switch and pulse width modulation (PWM) control circuit cooperating with the power switch to provide a desired output voltage of the converter. The ramp generator in one embodiment comprises a current source and an external capacitor connected thereto. In yet another embodiment, the ramp generator may be provided by a staircase ramp generator comprising an amplifier and an integrating capacitor connected thereto. A power-on-reset (POR) circuit is also preferably provided for discharging the integrating capacitor until the start-up phase of the converter.

39 Claims, 2 Drawing Sheets

DC-TO-DC CONVERTER WITH SOFT-START ERROR AMPLIFIER AND ASSOCIATED METHOD

FIELD OF THE INVENTION

The present invention relates to the field of electronics, and, more particularly, to a power converter, associated amplifier circuit, and related methods.

BACKGROUND OF THE INVENTION

Differential amplifiers, and especially error amplifiers, are widely used in control and regulation systems where it is desired to control the rise of the output voltage at the time power is applied. This may be important in DC-to-DC converters, for example, to avoid an overshoot of the regulated output voltage during the start-up phase. In control and regulations systems, differential or error amplifiers typically include an output stage which, in turn, includes a pair of transistors operating in a push-pull mode.

For example, the pull-up transistor is typically connected between the output node and the supply, and the pull-down transistor is connected between the output node and ground. The output node is often also typically connected to the input of a comparator. At start-up, an out-of-balance condition of the inputs of the amplifier may cause a sudden saturation rise of the output node toward the supply voltage. A steep rise of the output voltage toward the supply may cause undesired over-shoot of the value controlled by the regulating system, such as the output of the DC-to-DC converter.

As disclosed in U.S. Pat. No. 5,532,645 to Fagnani et al., the voltage rise at the output node of the error amplifier at start-up has been slowed by introducing a circuit for controlling the voltage rise on an internal driving node of the amplifier or on the output node. For example, the output has been tied to a voltage of a so-called "soft-start" capacitor which is charged with a constant current. The patent further discloses that one previous approach is based on using a PNP transistor with an emitter connected to the output node, a collector connected to a common ground node of the amplifier, and a base connected to an external soft-start capacitor. The external soft-start capacitor may be charged through a charge path that is functionally external to the structure of the amplifier. The PNP transistor prevents too steep a rise of the voltage on the output of the amplifier.

Unfortunately, this approach had several drawbacks. It is generally desired to reduce the size of the external soft-start capacitor, to reduce the current consumption. A diode or transistor that is capable of producing a base current of a few milliamperes, may often be incompatible with a soft-start capacitor requiring a charge current of a few milliamperes. In other words, the base current of the transistor may represent an excessive contribution to the charge current of the soft-start capacitor.

Accordingly, U.S. Pat. No. 5,532,645 discloses a significant advance over the prior control circuits. The patent discloses a circuit for tying the output voltage of an amplifier using a small size soft-start capacitor, while keeping the total charge current to only a few microamperes. The circuit includes a feedback path to control the driving level of the pull-up transistor in the amplifier's output stage. The transistor outputs the charge current for the soft-start capacitor to thereby limit the charge current delivered through a diode to the external capacitor connected to a dedicated soft-start pin of the integrated device. The feedback circuit includes a pair of complementary current mirrors, through which the charge current that flows through the charge diode to the external soft-start capacitor is mirrored in a suitable ratio. The current is mirrored on the base of the same transistor of the push-pull output stage of the amplifier that delivers the charge current to thereby partially reduce its drive condition.

Within the control loop, a certain current balance is achieved such that the current forced by the respective bias current generator of the output transistor that delivers the charge current of the output node is counterbalanced, at least partially, by the current that is a function of the active charge current which is fed to the base of the transistor through the current mirror of the feedback circuit. Accordingly the output node gradually charges itself toward the supply voltage.

An auxiliary current generator may be employed for ensuring a complete charge of the external soft-start capacitor which, at start-up, the output node of the amplifier stabilizes at a certain level imposed by the regulating chain including the amplifier. In any case, upon reaching a fully charged state by the external soft-start capacitor, the charge diode which is part of the first current mirror cuts itself off, thus isolating the control soft-start circuit from the functional circuit of the amplifier.

Unfortunately, the circuitry required for the soft-start function as disclosed in U.S. Pat. No. 5,532,645 and based upon driving from the output of the amplifier may be relatively complicated. In the past and as disclosed in the patent, it was also thought that attempting to provide the soft-start feature on an internal driving node of the amplifier would present severe difficulties, since only a few millivolts may be sufficient to completely unbalance an amplifier.

SUMMARY OF THE INVENTION

In view of the foregoing background, it is therefore an object of the present invention to provide a DC-to-DC converter and associated amplifier circuit that provides a soft-start function reliably and without complicated capacitor charging circuitry associated with an output of the amplifier.

This and other objects, advantages and features in accordance with the present invention are provided by a DC-to-DC converter comprising an error amplifier, and ramp generator means for generating a ramp signal at the first input of the error amplifier independent of the output of the error amplifier and so that the output of the error amplifier ramps up at a relatively slow rate to avoid overshoot of the desired output voltage of the converter during the start-up phase of the converter. The converter also preferably includes ramp disable means for disabling the ramp signal upon reaching a value corresponding to the normal operating phase of the converter. In other words, the invention is directed to an amplifier circuit having a start-up phase and a normal operating phase, and wherein the amplifier circuit ramp generator generates a ramp signal at the input of the amplifier independent of the output of the amplifier and so that the output of the amplifier ramps up at a relatively slow rate during the start-up phase. The DC-to-DC converter preferably also comprises at least one power switch and pulse width modulation (PWM) control means cooperating with the power switch to provide a desired output voltage of the converter.

The ramp generator means in one embodiment may be provided by a current source and an external capacitor connected thereto. In another embodiment, the ramp generator means may be provided by a switched capacitor filter.

In yet another embodiment, the ramp generator means may comprise a staircase ramp generator which, in turn, includes an amplifier and an integrating capacitor connected thereto. This embodiment advantageously avoids the need for an external capacitor. A power-on-reset (POR) circuit is also preferably provided for discharging the integrating capacitor until the start-up phase of the converter. The staircase ramp generator may further comprise an input capacitor and switcher associated therewith.

The ramp disable means may be provided in one embodiment by a first switch for connecting the ramp signal to the first input of the error amplifier, and a second switch for connecting an input signal to the first input of the error amplifier. This embodiment also preferably includes switch control means for operating the first and second switches to couple the input of the error amplifier to a lesser of the input signal or the ramp signal and for disconnecting the ramp signal after the ramp signal exceeds the input signal. The switch control means, in turn, may include a comparator for comparing the ramp signal to the input signal, and logic means connected between the comparator and the first and second switches. In addition, the comparator may preferably be a hysteretic comparator to provide more stable operation.

In another variation of the invention, the ramp disable means may be provided by first and second diodes. More particularly, the first diode is for operatively connecting the ramp signal to the first input of the error amplifier, and the second diode is for operatively connecting an input signal to the first input of the error amplifier. Accordingly, the input of the error amplifier is coupled to a lesser of the input signal or the ramp signal and is disconnected from the ramp signal after the ramp signal exceeds the input signal.

A method aspect of the invention is for operating an amplifier circuit having a start-up phase and a normal operating phase, such as an error amplifier in a DC-to-DC converter. The amplifier circuit preferably comprises an amplifier having an output and having first and second inputs. The method preferably comprises the steps of: generating a ramp signal at the first input of the amplifier independent of the output of the amplifier and so that the output of the amplifier ramps up at a relatively slow rate during the start-up phase; and disabling the ramp signal upon reaching a value corresponding to the normal operating phase.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and double prime notation are used to indicate similar elements in alternative embodiments.

Figure 1:
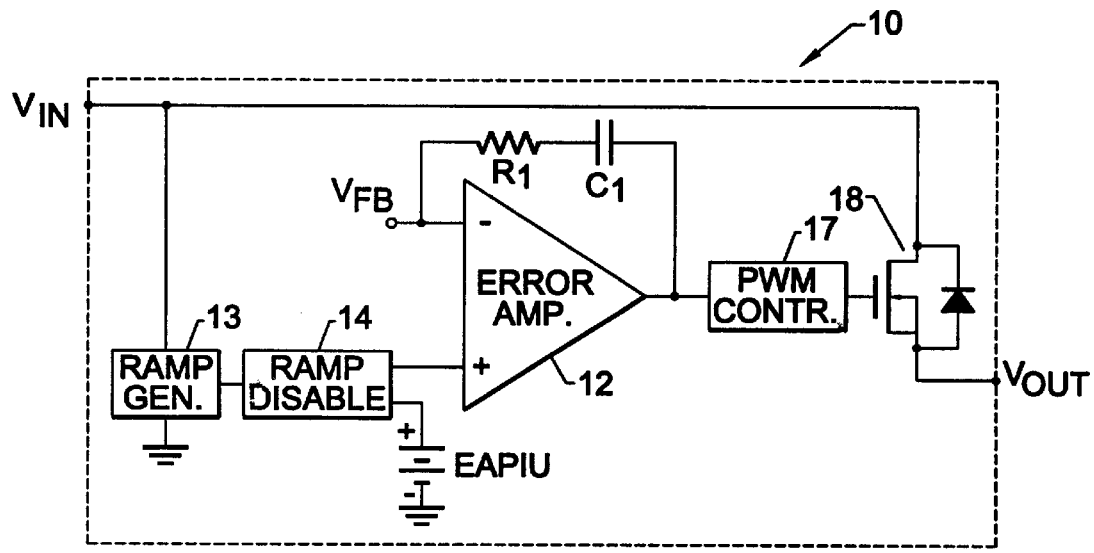
FIG. 1 is a schematic block diagram of a DC-to-DC converter and including an error amplifier and ramp circuits in accordance with the present invention.
Figure 2:
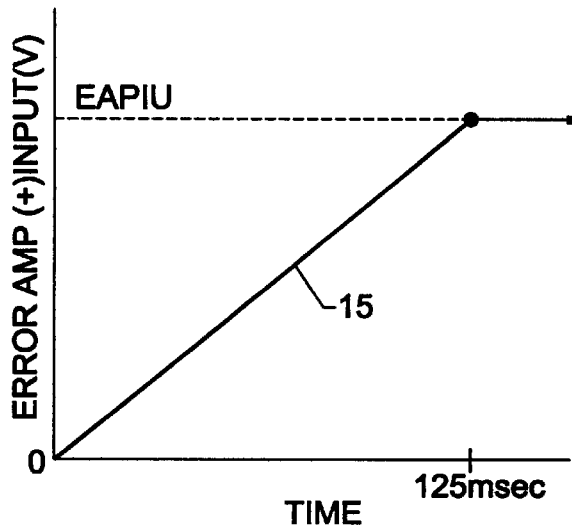
FIG. 2 is a graph of the input voltage at the non-inverting input of the error amplifier as shown in FIG. 1.

Referring to FIGS. 1–2, a first embodiment of a DC-to-DC converter 10 and its operation are initially described. The DC-to-DC converter 10 illustratively includes an error amplifier 12 and ramp generator means 13 for generating a ramp signal at the first input of the error amplifier independent of the output of the error amplifier. The DC-to-DC converter 10 also includes ramp disable means 14 for disabling the ramp signal upon reaching a value corresponding to the normal operating phase of the converter. In other words, the DC-to-DC converter 10 supplies the lesser of the ramp signal 15 or the input signal EAPIU (FIG. 2) to the non-inverting input (+) of the error amplifier 12.

The DC-to-DC converter 10 also includes a pulse width control circuit 17 coupled to the output of the error amplifier 12, and at least one power switch 18 which, in turn, is coupled to the output of the PWM control circuit. Of course, as would be readily appreciated by those skilled in the art, the PWM control circuit 17 may also include logic and drive circuitry for the power switch 18.

The illustrated DC-to-DC converter 10 also includes a feedback capacitor C1 and resistor R1 conventionally connected between the output and the inverting input (−). As would be readily understood by those skilled in the art, a feedback control voltage Vfb based upon an output Vout of the converter may also be supplied to the inverting input (−). The DC-to-DC converter 10 has a start-up phase and a normal operating phase. As shown in the plot of FIG. 2, the present invention provides a soft-start function by causing the input, and thus the output, of the error amplifier 12 to ramp up at a relatively slow rate. The invention thus avoids overshoot of the desired output voltage Vout of the converter 10 during the start-up phase of the converter. The output of the error amplifier 12 is caused to ramp slowly based upon the application of the ramp signal, and appropriate switching at the non-inverting input (+) of the amplifier. Those of skill in the art will readily appreciate that the same principles may be used for the inverting input (−) of the amplifier 12, as well.

In other words, the invention is directed to an amplifier circuit having a start-up phase and a normal operating phase, and wherein the amplifier circuit further includes a ramp generator 13 for generating a ramp signal 15 (FIG. 2) at an input of the amplifier 12 independent of the output of the amplifier so that the output of the amplifier ramps up at a relatively slow rate during the start-up phase. The circuit also includes ramp disable means 14 for disabling the ramp signal upon reaching a value corresponding to the normal operating phase.

The DC-to-DC converter 10 of the present invention is different than the DC-to-DC converter disclosed in U.S. Pat. No. 5,532,645 which includes an external capacitor charged by current delivered by a pull-up transistor of a push-pull output stage of the amplifier, and which also includes a current mirror feedback circuit for mirroring the charging current of the external soft-start capacitor onto the driving node of the pull-up transistor. According to the present invention, the ramp generator 13 and ramp disable circuit 14 operate independent of the output of the error amplifier 12, and instead are coupled to an input of the amplifier.

The illustrated error amplifier 12 in accordance with the present may include a differential input stage and a push-pull output stage connected thereto as in U.S. Pat. No. 5,532,645, the entire disclosure of which is incorporated herein by reference. However, the various circuitry associated with the output and current mirrors are not needed in the straightforward approach in accordance with the present invention as will be readily appreciated by those skilled in the art.

Figure 3:
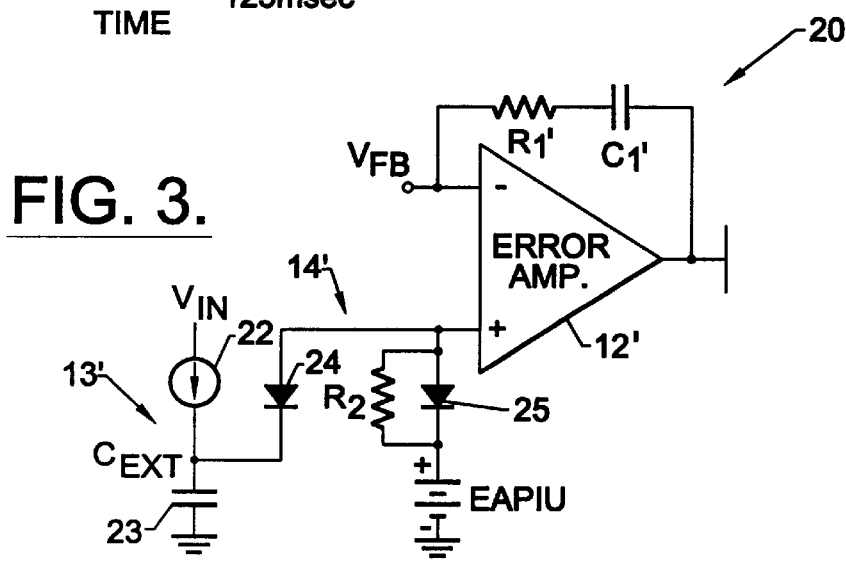
FIG. 3 is a schematic circuit diagram of another embodiment of the error amplifier and ramp circuits in accordance with the present invention.

Turning now to FIG. 3 a more specific embodiment of an amplifier circuit 20 is described including the error amplifier 12' and its associated feedback components C1', R1'. In the illustrated embodiment, the ramp generator means 13' is provided by a current source 22 and an external capacitor 23 connected across the voltage supply. For example, the external capacitor 23 may have a value of about 2.2 $\mu$F and the charging current may be about 10 $\mu$A. The ramp signal is generated at the node of the capacitor 23 as will be readily appreciated by those skilled in the art.

The ramp disable means 14' is illustratively provided by the first diode 24 connected between the non-inverting input (+) of the amplifier 12' and the capacitor 23, and a second diode 25 connected between the non-inverting input (+) and the input EAPIU. The first diode 24 is for operatively connecting the ramp signal to the first input of the error amplifier 12', and the second diode 25 is for operatively connecting an input signal EAPIU to the error amplifier. The amplifier circuit 20 also includes a relatively high value resistor R2 of about $1 \times 10^6$ $\Omega$ shunted across the diode 25. The resistor R2 allows the non-inverting input (+) of the error amplifier 12 to go to the value of EAPIU after the diode 24 reverse biases. As would be readily understood by those skilled in the art, since the resistor R2 has a relatively high value, it does not affect the "OR" function of the two diodes 24, 25, and the voltage at the non-inverting input (+) is still the lesser of the ramp voltage or EAPIU.

As would be readily understood by those skilled in the art, the input of the error amplifier 12' is coupled to a lesser of the input signal or the ramp signal and is disconnected from the ramp signal after the ramp signal exceeds the input signal. The input ramps slowly upward and when the ramp reaches the input EAPIU, the ramp is effectively removed from the circuit 20.

Figure 4:
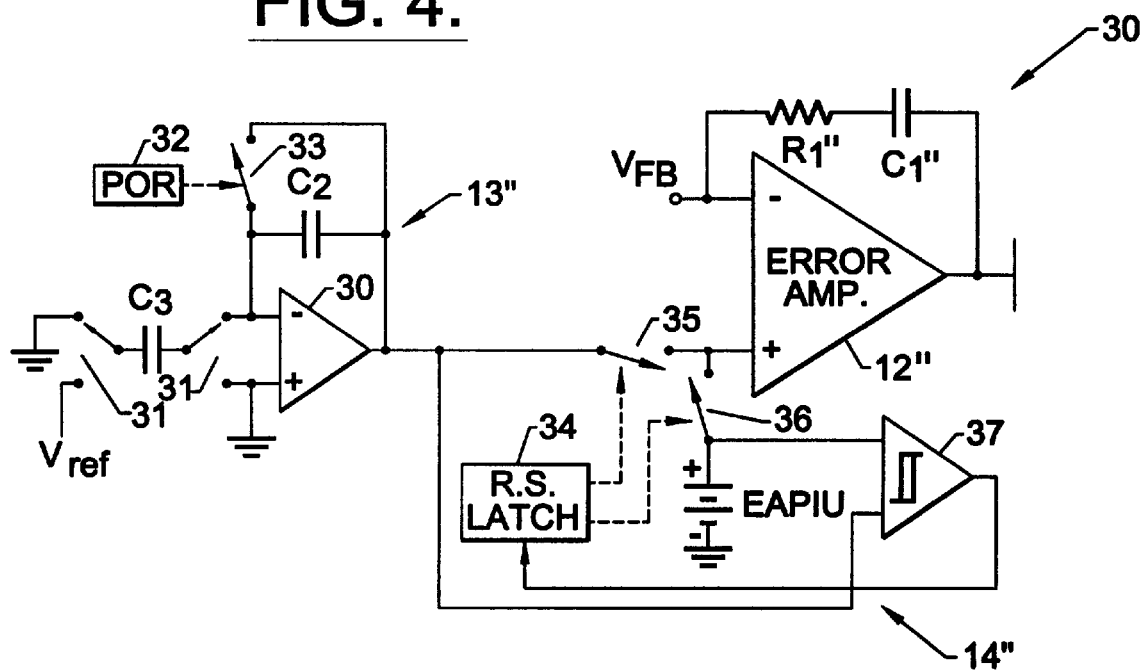
FIG. 4 is a schematic circuit diagram of yet another embodiment of the error amplifier and ramp circuits in accordance with the present invention.
Figure 5:
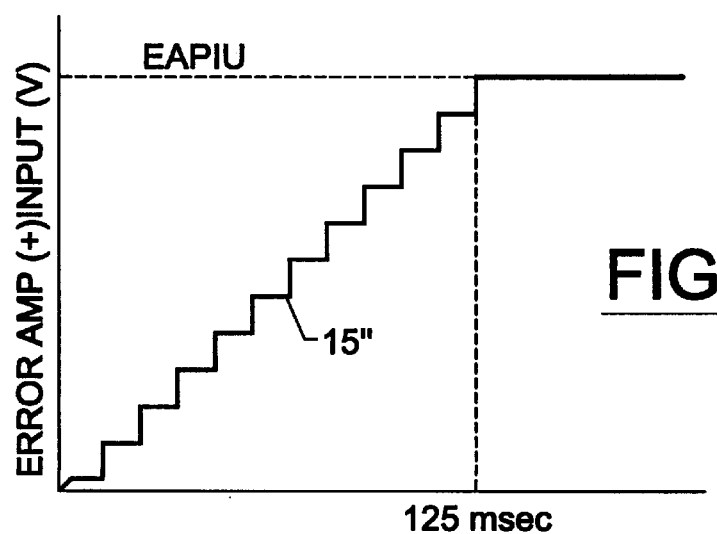
FIG. 5 is a graph of the input voltage at the non-inverting input of the error amplifier as shown in FIG. 4.

Yet another embodiment of the invention is understood with further reference to FIGS. 4 and 5. In the illustrated embodiment, the ramp generator is provided by a staircase ramp generator 13" comprising an amplifier 30 and an integrating capacitor C2 connected thereto. A power-on-reset (POR) circuit 32 coupled to the schematically illustrated switch 33 is preferably provided for discharging the integrating capacitor C2 until the start-up phase of the converter. In other words, the POR circuit 32 keeps the capacitor C2 at zero until needed to start the ramp. An important feature of this embodiment, is that an external capacitor may not be needed.

The staircase ramp generator 13" also illustratively includes the input capacitor C3 and switches 31 associated therewith to produce a staircase ramp 15" as shown in FIG. 5. Using for example, a switching frequency of 2 kHz, an input capacitor C3 of 0.25 pF, and an integrating capacitor C2 of 25 pF, a staircase ramp may be generated which would rise from 0 V to about 2.5 V in about 125 msec with a Vref of 1 V. As would be readily understood by those skilled in the art, the step size is determined by Vref (C3/C2). Of course, other values could also be used as would be appreciated by those skilled in the art.

The ramp disable means 14" in the circuit 30 of FIG. 4, may be provided by a first switch 35 for connecting the staircase ramp signal 15" to the non-inverting input (+) of the error amplifier 12", and a second switch 36 for connecting an input signal EAPIU to the input of the error amplifier. The circuit 30 also illustratively includes switch control means for operating the first and second switches 35, 36 to couple the input of the error amplifier to a lesser of the input signal or the staircase ramp signal, and for disconnecting the ramp signal after the ramp signal exceeds the input signal.

The switch control means, in turn, includes a comparator and, more preferably, the illustrated hysteretic comparator 37 for comparing the ramp signal to the input signal. A simple logic circuit in the form of the illustrated RS latch 34 controls the first and second switches 35, 36 based upon the output of the hysteretic comparator 37. As would be readily appreciated by those skilled in the art, the hysteretic comparator 37 may provide more stable operation for the circuit 30. The diode arrangement of the embodiment as shown in FIG. 3 may also be used in conjunction with the staircase ramp generator 13" as will be readily appreciated by those skilled in the art.

A method aspect of the invention is for operating an amplifier circuit having a start-up phase and a normal operating phase, such as an error amplifier 12 in a DC-to-DC converter 10. The amplifier circuit preferably comprises an amplifier having an output and having first and second inputs. The method preferably comprises the steps of: generating a ramp signal at the first input of the amplifier independent of the output of the amplifier and so that the output of the amplifier ramps up at a relatively slow rate during the start-up phase; and disabling the ramp signal upon reaching a value corresponding to the normal operating phase.

Many modifications and other embodiments of the invention will come to the mind of one skilled in the art having the benefit of the teachings presented in the foregoing descriptions and the associated drawings. For example, the ramp generator means in yet a further embodiment may be provided by a switched capacitor filter as will be readily understood by those skilled in the art. Therefore, it is to be understood that the invention is not to be limited to the specific embodiments disclosed, and that modifications and embodiments are intended to be included within the scope of the appended claims.

That which is claimed is:

1. A DC-to-DC converter having a start-up phase and a normal operating phase, said DC-to-DC converter comprising:

at least one power switch;

pulse width modulation (PWM) control means cooperating with said at least one power switch to provide a desired output voltage of the converter;

an error amplifier having an output connected to said PWM control means and having first and second inputs;

ramp generator means for generating a ramp signal at the first input of said error amplifier independent of the output of said error amplifier and so that the output of said error amplifier ramps up at a relatively slow rate to avoid overshoot of the desired output voltage of the converter during the start-up phase of the converter; and ramp disable means for disabling the ramp signal upon reaching a value corresponding to the normal operating phase of the converter.

2. A DC-to-DC converter according to claim 1 wherein said ramp generator means comprises a current source and an external capacitor connected thereto.

3. A DC-to-DC converter according to claim 1 wherein said ramp generator means comprises:
   a staircase ramp generator comprising an amplifier and an integrating capacitor connected thereto; and
   power-on-reset (POR) means for discharging the integrating capacitor until the start-up phase of the converter.

4. A DC-to-DC converter according to claim 3 wherein said staircase ramp generator further comprises an input capacitor and switches associated therewith.

5. A DC-to-DC converter according to claim 1 wherein said ramp disable means comprises:
   a first switch for connecting the ramp signal to the first input of said error amplifier;
   a second switch for connecting an input signal to the first input of said error amplifier; and
   switch control means for operating the first and second switches to couple the input of said error amplifier to a lesser of the input signal or the ramp signal and for disconnecting the ramp signal after the ramp signal exceeds the input signal.

6. A DC-to-DC converter according to claim 5 wherein said switch control means comprises:
   a comparator for comparing the ramp signal to the input signal; and
   logic means connected between said comparator and said first and second switches.

7. A DC-to-DC converter according to claim 6 wherein said comparator comprises a hysteretic comparator.

8. A DC-to-DC converter according to claim 1 wherein said ramp disable means comprises:
   a first diode for operatively connecting the ramp signal to the first input of said error amplifier; and
   a second diode for operatively connecting an input signal to the first input of said error amplifier;
   whereby the input of said error amplifier is coupled to a lesser of the input signal or the ramp signal and is disconnected from the ramp signal after the ramp signal exceeds the input signal.

9. A DC-to-DC converter according to claim 1 wherein said error amplifier comprises a differential input stage.

10. A DC-to-DC converter according to claim 9 wherein the first input is a non-inverting input of said differential input stage.

11. A DC-to-DC converter having a start-up phase and a normal operating phase, said DC-to-DC converter comprising:
    at least one power switch;
    pulse width modulation (PWM) control means cooperating with said at least one power switch to provide a desired output voltage of the converter;
    an error amplifier having an output connected to said PWM control means and having first and second inputs;
    a staircase ramp generator comprising an amplifier and an integrating capacitor connected thereto for generating a staircase ramp signal at the first input of said error amplifier so that the output of said error amplifier ramps up at a relatively slow rate to avoid overshoot of the desired output voltage of the converter during the start-up phase of the converter; and
    ramp disable means for disabling the ramp signal upon reaching a value corresponding to the normal operating phase of the converter.

12. A DC-to-DC converter according to claim 11 wherein said staircase ramp generator operates independent of the output of said error amplifier.

13. A DC-to-DC converter according to claim 11 wherein said staircase ramp generator further comprises power-on-reset (POR) means for discharging the integrating capacitor until the start-up phase of the converter.

14. A DC-to-DC converter according to claim 11 wherein said staircase ramp generator further comprises an input capacitor and switches associated therewith.

15. A DC-to-DC converter according to claim 11 wherein said ramp disable means comprises:
    a first switch for connecting the staircase ramp signal to the first input of said error amplifier;
    a second switch for connecting an input signal to the first input of said error amplifier; and
    switch control means for operating the first and second switches to couple the input of said error amplifier to a lesser of the input signal or the staircase ramp signal and for disconnecting the staircase ramp signal after the staircase ramp signal exceeds the input signal.

16. A DC-to-DC converter according to claim 15 wherein said switch control means comprises:
    a comparator for comparing the ramp signal to the input signal; and
    logic means connected between said comparator and said first and second switches.

17. A DC-to-DC converter according to claim 16 wherein said comparator comprises a hysteretic comparator.

18. A DC-to-DC converter according to claim 11 wherein said ramp disable means comprises:
    a first diode for operatively connecting the staircase ramp signal to the first input of said error amplifier; and
    a second diode for operatively connecting an input signal to the first input of said error amplifier;
    whereby the input of said error amplifier is coupled to a lesser of the input signal or the staircase ramp signal and is disconnected from the staircase ramp signal after the staircase ramp signal exceeds the input signal.

19. A DC-to-DC converter according to claim 11 wherein said error amplifier comprises a differential input stage.

20. A DC-to-DC converter according to claim 19 wherein the first input is a non-inverting input of said differential input stage.

21. An amplifier circuit having a start-up phase and a normal operating phase, said amplifier circuit comprising:
    an amplifier having an output and having first and second inputs;
    ramp generator means for generating a ramp signal at the first input of said amplifier independent of the output of said amplifier and so that the output of said amplifier ramps up at a relatively slow rate during the start-up phase; and
    ramp disable means for disabling the ramp signal upon reaching a value corresponding to the normal operating phase.

22. An amplifier circuit according to claim 21 wherein said ramp generator means comprises a current source and an external capacitor connected thereto.

23. An amplifier circuit according to claim 21 wherein said ramp generator means comprises:
    a staircase ramp generator comprising an amplifier and an integrating capacitor connected thereto; and
    power-on-reset (POR) means for discharging the integrating capacitor until the start-up phase of the converter.

24. An amplifier circuit according to claim 23 wherein said staircase ramp generator further comprises an input capacitor and switches associated therewith.

25. An amplifier circuit according to claim 21 wherein said ramp disable means comprises:
   a first switch for connecting the ramp signal to the first input of said amplifier;
   a second switch for connecting an input signal to the first input of said amplifier; and
   switch control means for operating the first and second switches to couple the input of said amplifier to a lesser of the input signal or the ramp signal and for disconnecting the ramp signal after the ramp signal exceeds the input signal.

26. An amplifier circuit according to claim 25 wherein said switch control means comprises:
   a comparator for comparing the ramp signal to the input signal; and
   logic means connected between said comparator and said first and second switches.

27. An amplifier circuit according to claim 26 wherein said comparator comprises a hysteretic comparator.

28. An amplifier circuit according to claim 21 wherein said ramp disable means comprises:
   a first diode for operatively connecting the ramp signal to the first input of said amplifier; and
   a second diode for operatively connecting an input signal to the first input of said amplifier;
   whereby the input of said amplifier is coupled to a lesser of the input signal or the ramp signal and is disconnected from the ramp signal after the ramp signal exceeds the input signal.

29. An amplifier circuit according to claim 21 wherein said amplifier comprises a differential input stage.

30. An amplifier circuit according to claim 29 wherein the first input is a non-inverting input of said differential input stage.

31. A method for operating an amplifier circuit having a start-up phase and a normal operating phase, the amplifier circuit comprising an amplifier having an output and having first and second inputs, the method comprising the steps of:
   generating a ramp signal at the first input of the amplifier independent of the output of the amplifier and so that the output of the amplifier ramps up at a relatively slow rate during the start-up phase; and
   disabling the ramp signal upon reaching a value corresponding to the normal operating phase.

32. A method according to claim 31 wherein the amplifier comprises an error amplifier of a DC-to-DC converter.

33. A method according to claim 31 wherein the step of generating the ramp signal comprises charging an external capacitor with a current source.

34. A method according to claim 31 wherein the step of generating the ramp signal comprises the steps of:
   generating a staircase ramp signal using an amplifier and an integrating capacitor connected thereto; and
   discharging the integrating capacitor until the start-up phase of the converter.

35. A method according to claim 31 wherein the step of disabling the ramp signal comprises the steps of:
   providing a first switch for connecting the ramp signal to the first input of the amplifier;
   providing a second switch for connecting an input signal to the first input of the amplifier; and
   operating the first and second switches to couple the input of the amplifier to a lesser of the input signal or the ramp signal and for disconnecting the ramp signal after the ramp signal exceeds the input signal.

36. A method according to claim 35 wherein the step of operating the first and second switches comprises the step of comparing the ramp signal to the input signal.

37. A method according to claim 36 wherein the step of comparing comprises comparing with hysteresis.

38. A method according to claim 31 wherein the step of disabling the ramp signal comprises the steps of:
   connecting a first diode between the ramp signal to the first input of the amplifier; and
   connecting a second diode between the input signal and the first input of the amplifier;
   whereby the input of the amplifier is coupled to a lesser of the input signal or the ramp signal and is disconnected from the ramp signal after the ramp signal exceeds the input signal.

39. A method according to claim 31 wherein the step of generating the ramp signal at the first input comprises generating the ramp signal at a non-inverting input of the amplifier.

* * * * *